United States Patent [19]
Gardner

[11] Patent Number: 5,990,532
[45] Date of Patent: *Nov. 23, 1999

[54] SEMICONDUCTOR ARRANGEMENT WITH LIGHTLY DOPED REGIONS UNDER A GATE STRUCTURE

[75] Inventor: Mark I. Gardner, Cedar Creek, Tex.

[73] Assignee: Advanced Micro Devices, Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/993,383

[22] Filed: Dec. 18, 1997

[51] Int. Cl.⁶ .................................................. H01L 29/772
[52] U.S. Cl. .......................... 257/410; 257/344; 257/408; 257/411
[58] Field of Search .................................. 257/410, 411, 257/408, 344

[56] References Cited

U.S. PATENT DOCUMENTS

| | | | |
|---|---|---|---|
| 5,471,080 | 11/1995 | Satoh et al. | 257/344 |
| 5,717,222 | 2/1998 | Nakamura | 257/38 |
| 5,736,446 | 4/1998 | Wu | 438/305 |
| 5,766,998 | 6/1998 | Tseng | 438/291 |
| 5,770,507 | 6/1998 | Chen et al. | 438/305 |
| 5,786,254 | 7/1998 | Hao et al. | 438/287 |
| 5,864,160 | 1/1999 | Buynoski | 257/339 |

FOREIGN PATENT DOCUMENTS 63-177469  7/1988  Japan ................................... 247/410

*Primary Examiner*—Jerome Jackson, Jr.
*Assistant Examiner*—B Wm Baumeister

[57] ABSTRACT

The formation of lightly doped regions under a gate of a transistor via gate autodoping is disclosed. One embodiment of the invention is a method having four steps. In the first step, a gate having two sidewalls is provided over a gate oxide over a semiconductor substrate; source and drain regions with the substrate adjacent to the sidewalls of the gate are also provided. In the second step, the gate oxide is etched to reduce the length of the gate oxide. In the third step, a spacer is formed at each sidewall of the gate to create at each side of the gate oxide an air cavity defined by the spacer, the gate, the substrate and the gate oxide. In the fourth step, a rapid thermal anneal is performed to form lightly doped regions within the substrate, as autodoped from the gate.

17 Claims, 4 Drawing Sheets

SEMICONDUCTOR ARRANGEMENT WITH LIGHTLY DOPED REGIONS UNDER A GATE STRUCTURE

FIELD OF THE INVENTION

The present invention relates generally to integrated circuit manufacturing and more particularly to the formation of lightly doped regions under a gate structure.

BACKGROUND OF THE INVENTION

An insulated-gated field-effect transistor (IGFET), such as a metal-oxide semiconductor field-effect transistor (MOSFET), uses a gate to control an underlying surface channel joining a source and a drain. The channel, source and drain are located within a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in the channel in order to modulate the longitudinal conductance of the channel.

The buildup or depletion of charge resulting from the application of a voltage to the gate creates a channel under the gate connecting the source and the drain. The surface of the semiconductor is said to be inverted. The source is biased with a voltage and the drain is grounded relative to the source. In this condition, a current starts to flow as the inverted surface creates an electrically connecting channel. The source and drain are essentially shorted together. Applying more voltage to the gate increases the size of the channel (height-wise), allowing more current to flow through the transistor. By controlling the gate voltage, an IGFET transistor can be used as a switch (on/off) or an amplifier.

Typically, a lightly doped drain (LDD) extension is created within the substrate adjacent to each side of the gate. Such lightly doped regions are usually created by first applying an ion implantation to lightly dope the substrate, and then forming a spacer, such as a nitride spacer, to each side of the gate to act as a mask for a second ion implantation to create heavily doped regions (i.e., the source and drain regions). The channel length of such a transistor, therefore, is the width of the gate itself, since the area of substrate underneath the gate between the lightly doped regions is the same length as the gate width.

For high-performance IGFET applications, such as microprocessors, short channel length is desirable; the shorter the channel length, the less distance the carriers have to traverse in order to move from the source to the drain. LDD extensions are in fact used because in IGFETs having channel lengths less than two micron, the heavily doped regions of the source and the drain may otherwise bridge without the presence of the extensions. Furthermore, because of constraints in the minimum width to which a gate may be formed (as a result of either external requirements such as a certain length necessary for salicidation or metal contact connectability or processing limitations such as the minimum width that photoresist can be selectively sized to create the gate) the length of the channel is usually limited, too. Performance barriers are thus reached as minimum gate size is attained.

This approach is undesirable and becomes especially disadvantageous and problematic in applications where speed is of the utmost importance, such as in microprocessors. There is a need, therefore, to fabricate transistors having short channels than may otherwise be possible where channel length is equal to gate width.

SUMMARY OF THE INVENTION

The above-mentioned shortcomings, disadvantages and problems are addressed by the present invention, which will be understood by reading and studying the following specification. The invention relates to the formation of lightly doped regions under a gate via gate autodoping. In one embodiment, a method includes four steps. In the first step, a gate having two sidewalls is provided over a gate oxide over a semiconductor substrate; source and drain regions with the substrate adjacent to the sidewalls of the gate are also provided. In the second step, the gate oxide is etched to reduce the length of the gate oxide. In the third step, a spacer is formed at each sidewall of the gate to create at each side of the gate oxide an air cavity defined by the spacer, the gate, the substrate and the gate oxide. Finally, in the fourth step, a rapid thermal anneal is performed to form lightly doped regions within the substrate, as autodoped from the gate.

Thus, the channel length of a transistor formed pursuant to this embodiment of the invention is less than the width of the gate, generally because of the reduction of the gate oxide, the creation of the air cavities and the autodoping into the substrate from the gate. The channel length is measured within the substrate between the lightly doped regions underneath the gate. The etching in the second step enables the subsequent creation of air cavities, such that the rapid thermal anneal results in autodoping from the gate to the substrate, creating these lightly doped regions underneath the gate. This means that for the same-sized gate as may be found in a prior art transistor, a transistor according to the invention will have a shorter channel, generally meaning that the inventive transistor will have better performance characteristics than those of the prior art transistor. This is an advantage of the invention.

The present invention describes methods, devices, and computerized systems of varying scope. In addition to the aspects and advantages of the present invention described here, further aspects and advantages of the invention will become apparent by reference to the drawings and by reading the detailed description that follows.

DETAILED DESCRIPTION OF THE INVENTION

In the following detailed description of exemplary embodiments of the invention, reference is made to the accompanying drawings which form a part hereof, and in which is shown by way of illustration specific exemplary embodiments in which the invention may be practiced. These embodiments are described in sufficient detail to enable those skilled in the art to practice the invention, and it is to be understood that other embodiments may be utilized and that logical, mechanical, electrical and other changes may be made without departing from the spirit or scope of the present invention. The following detailed description is, therefore, not to be taken in a limiting sense.

Figure 1A:
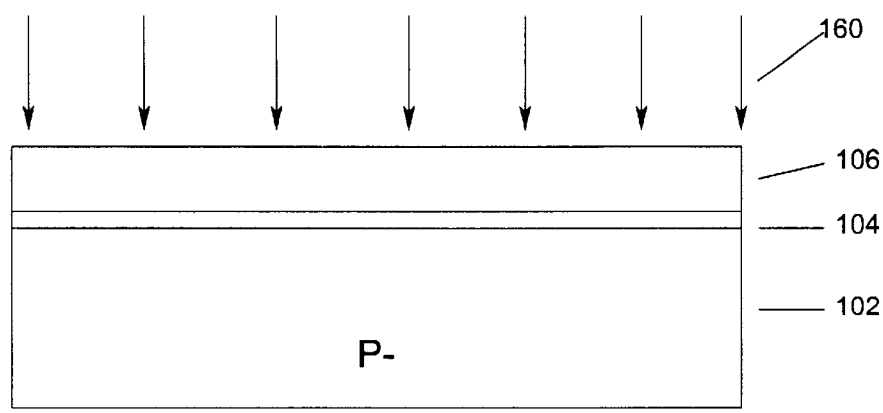
FIGS. 1A–1G show cross-sectional views of successive process steps for making an IGFET in accordance with one embodiment of the invention; and, FIG. 2 is a diagram of a computerized system, in accordance with which the invention may be implemented.

Described first is an IGFET known as a MOS. In FIG. 1A, silicon substrate 102 suitable for integrated circuit manufacture includes P-type epitaxial layer with a boron background concentration on the order of $1 \times 10^{16}$ atoms/cm$^3$, a <100> orientation and a resistivity of 12 ohm-cm. Desirably, the epitaxial surface layer is disposed on a P+ base layer, not shown, and includes a planar top surface. Gate oxide 104, comprise of silicon dioxide, is formed on the top surface of substrate 102 using oxide tube growth at a temperature of 700° C. to 1000° C., in an $O_2$ containing ambient. A typical oxidation tube contains several sets of electronically powered heating coils surrounding the tube, which is either quartz, silicon carbide, or silicon, desirably. In $O_2$ gas oxidation, the wafers are placed in the tube in a quartz "boat," and the gas flow is directed across the wafer surfaces to the opposite or exhaust end of the tub. Gate oxide 104 has a thickness of 30 angstroms, desirably.

Thereafter, a blanket layer of undoped polysilicon 106 is deposited by low pressure chemical vapor deposition (LPCVD) on the top surface of gate oxide 104. Polysilicon 106 has a thickness of 2000 angstroms, desirably. If also desired, polysilicon 106 can be doped in situ as deposition occurs, or doped before a subsequent etch step by implanting arsenic with a dosage in the range of $5 \times 10^{14}$ to $5 \times 10^{15}$ atoms/cm$^2$, and an energy in the range of 2 to 80 keV. However, it is generally desired that polysilicon 106 be doped during an implantation step following a subsequent etch step.

In FIG. 1A, the polysilicon 106 deposited on the substrate 102 is implanted with arsenic ions and then with nitrogen ions, as depicted by arrows 160. The arsenic ions enhance the rate of silicon dioxide growth in subsequent oxidation processes used to add or grow an additional layer of silicon dioxide. The arsenic ion implant has a dosage in the range of $5 \times 10^{14}$ to $5 \times 10^{15}$ atoms/cm$^2$, and an energy level ranging between about 2 to 80 keV. Doping with nitrogen is optional. The arrows 160 depict either the single step of doping with arsenic ions, or the two steps of doping with arsenic and then doping with nitrogen ions. The nitrogen ions may be added to retard the diffusion of the arsenic atoms. If the polysilicon is to be doped with nitrogen ions, the polysilicon may be implanted at this point in the process at a dosage of $5 \times 10^{14}$ to $5 \times 10^{15}$ atoms/cm$^2$, and at an energy level of 20 to 200 keV. Nitrogen ions may be implanting after etching the polysilicon.

Figure 1B:
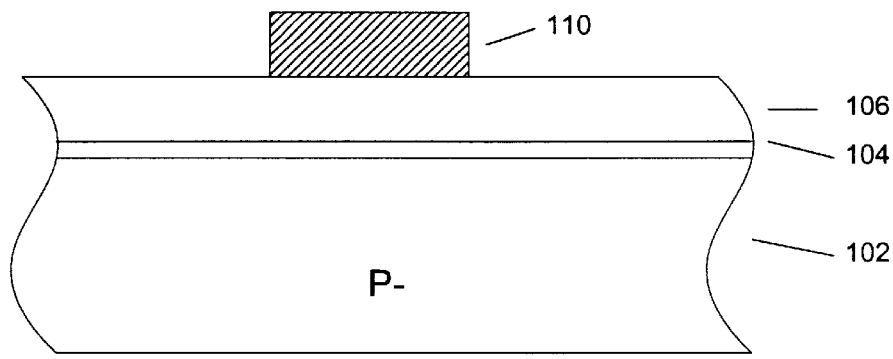

In FIG. 1B, photoresist 110 is deposited as a continuous layer on polysilicon 106 and selectively irradiated using a photolithographic system, such as a step and repeat optical projection system, in which I-line ultraviolet light from a mercury-vapor lamp is projected through a first reticle and a focusing lens to obtain a first image pattern. Thereafter, the photoresist 110 is developed and the irradiated portions of the photoresist are removed to provide openings in photoresist 110. The openings expose portions of polysilicon 106, thereby defining a gate.

Figure 1C:
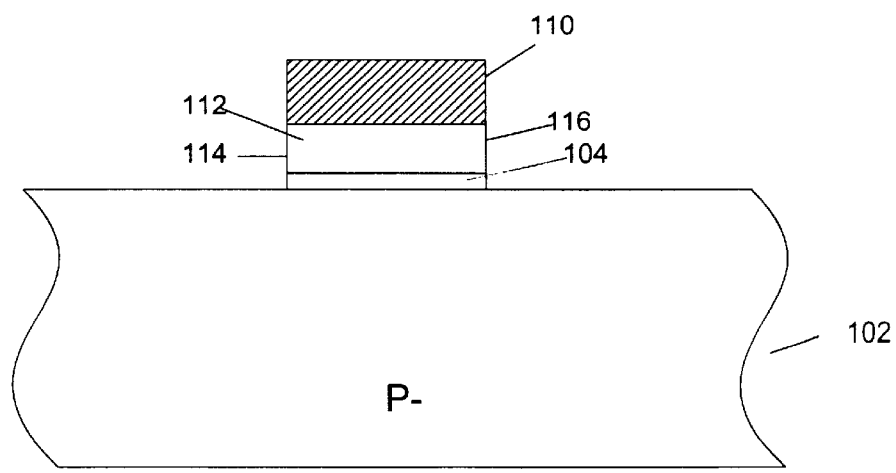

In FIG. 1C, an anisotropic etch is applied that removes the exposed portions of polysilicon 106 and the underlying portions of gate oxide 104. Desirably, a first dry etch is applied that is highly selective of polysilicon, and a second dry etch is applied that is highly selective of silicon dioxide, using photoresist 110 as an etch mask. After etching occurs, the remaining portion of polysilicon 106 provides polysilicon gate 112 with opposing vertical sidewalls (or, edges) 114 and 116. Polysilicon gate 112 has a length (between sidewalls 114 and 116) of 500–2500 angstroms, desirably.

Figure 1D:
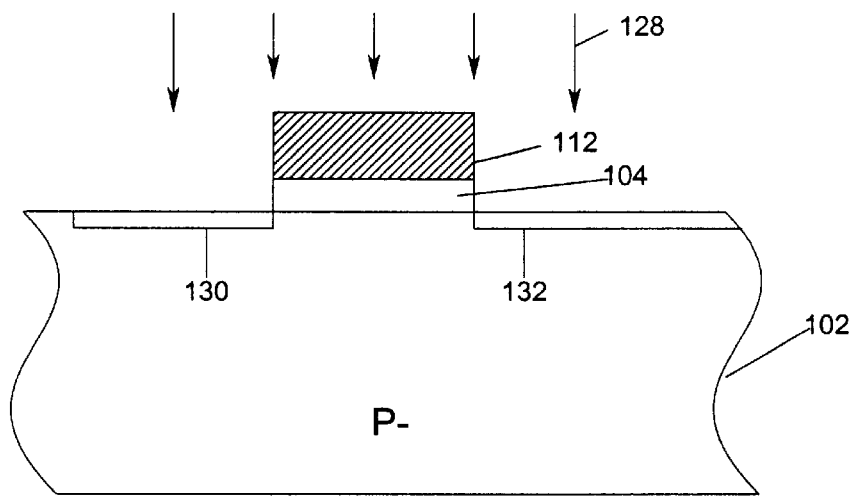

In FIG. 1D, photoresist 110 is stripped, and source and drain regions 130 and 132 are formed by an ion implantation, as represented by arrows 128. Source and drain regions 130 and 132 are heavily doped regions. The ion implantation may be an n-type dopant, such as arsenic, if an NMOSFET is desired, or a p-type dopant, such as boron, if a PMOSFET is desired. Optionally, after the ion implantation, a rapid thermal anneal may be applied to cure the source and drain regions.

Figure 1E:
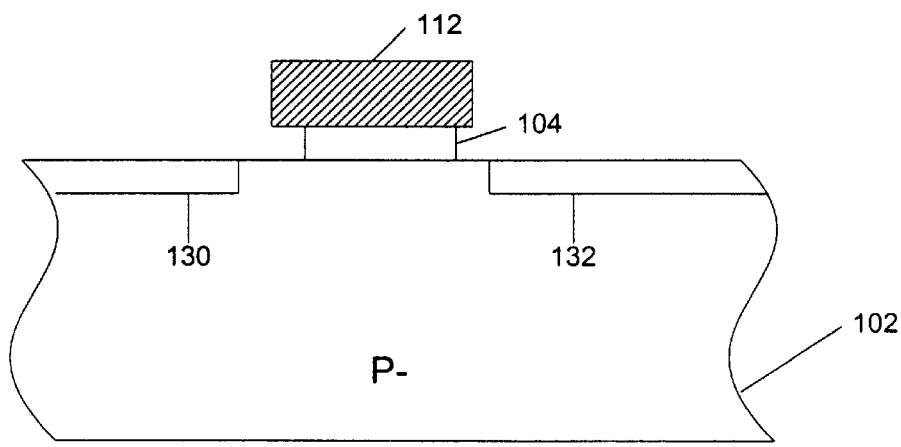
Figure 1F:
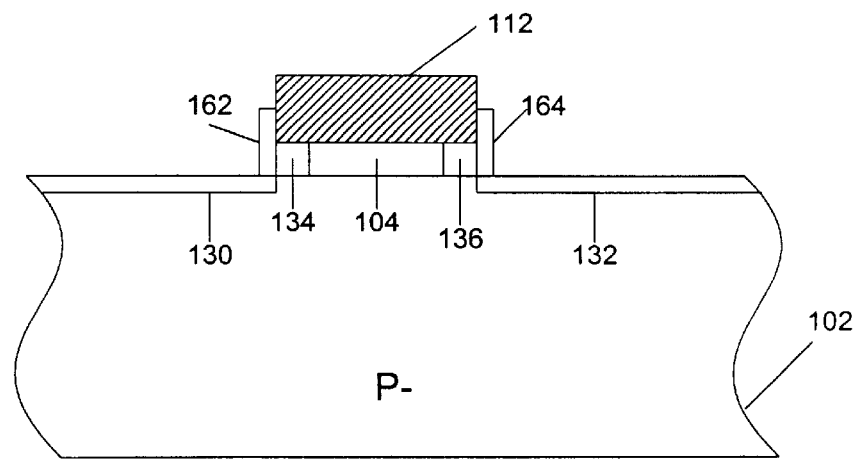

In FIG. 1E, an etchant is applied that removes a portion of gate oxide 104. The result is that the $L_{eff}$ of gate 112 is ultimately reduced, as can be appreciated by those skilled in the art. The etching of FIG. 1D is desirably a wet or dry oxide etch. The etching may be an HF dip, or a plasma etch, as known in the art. In FIG. 1F, spacers 162 and 164 are formed adjacent to the sidewalls of gate 112. Spacers 162 and 164 may be formed of nitride, but the invention is not so limited. Each spacer assists in defining a corresponding air cavity. Air cavity 134 is defined by spacer 162, gate 112, substrate 102 and gate oxide 104. Air cavity 136 is defined by spacer 164, gate 112, substrate 102 and gate oxide 104.

Figure 1G:
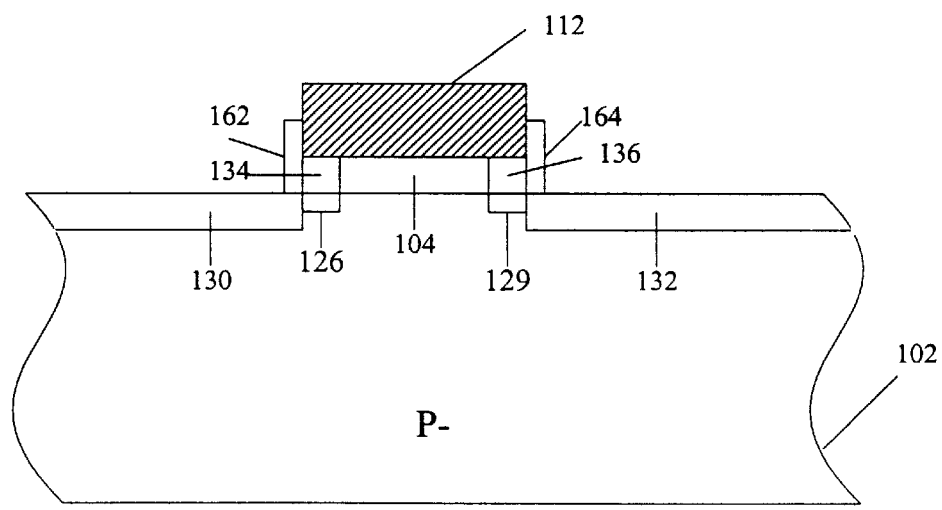

Finally, in FIG. 1G, lightly doped regions 126 and 129 are formed. A rapid thermal anneal is performed, which causes dopant from gate 112 (gate 112 being doped as a result of the ion implantation of FIG. 1D) to autodope substrate 102 underneath cavities 134 and 136, creating lightly doped regions 126 and 129. That is, dopant from gate 112, as a result of the rapid thermal anneal, moves to substrate 102. The dopant may be arsenic, boron, or any other suitable dopant.

The channel length of the transistor shown in FIG. 1G is measured as the distance within substrate 102 between the lightly doped regions 126 and 129. Because the lightly doped regions 126 and 129 are underneath the gate 112, and because oxide 104 has been etched away, the channel length is less than the width of the gate 112. This is advantageous to prior art transistors in which the lightly doped regions are adjacent to (and not underneath) the gate, because it results in a transistor having the same gate size, but a shorter channel length, resulting in a faster-performance transistor.

Not shown in FIG. 1G are the conventional processing steps of metal salicidation, placing glass over the surface, and forming a contact opening for subsequently placed connectors. A passivation layer may also then be deposited as a top surface. Additionally, the principal processing steps disclosed herein may be combined with other steps apparent and known to those skilled in the art. The invention is not particularly limited in this regard.

Figure 2:
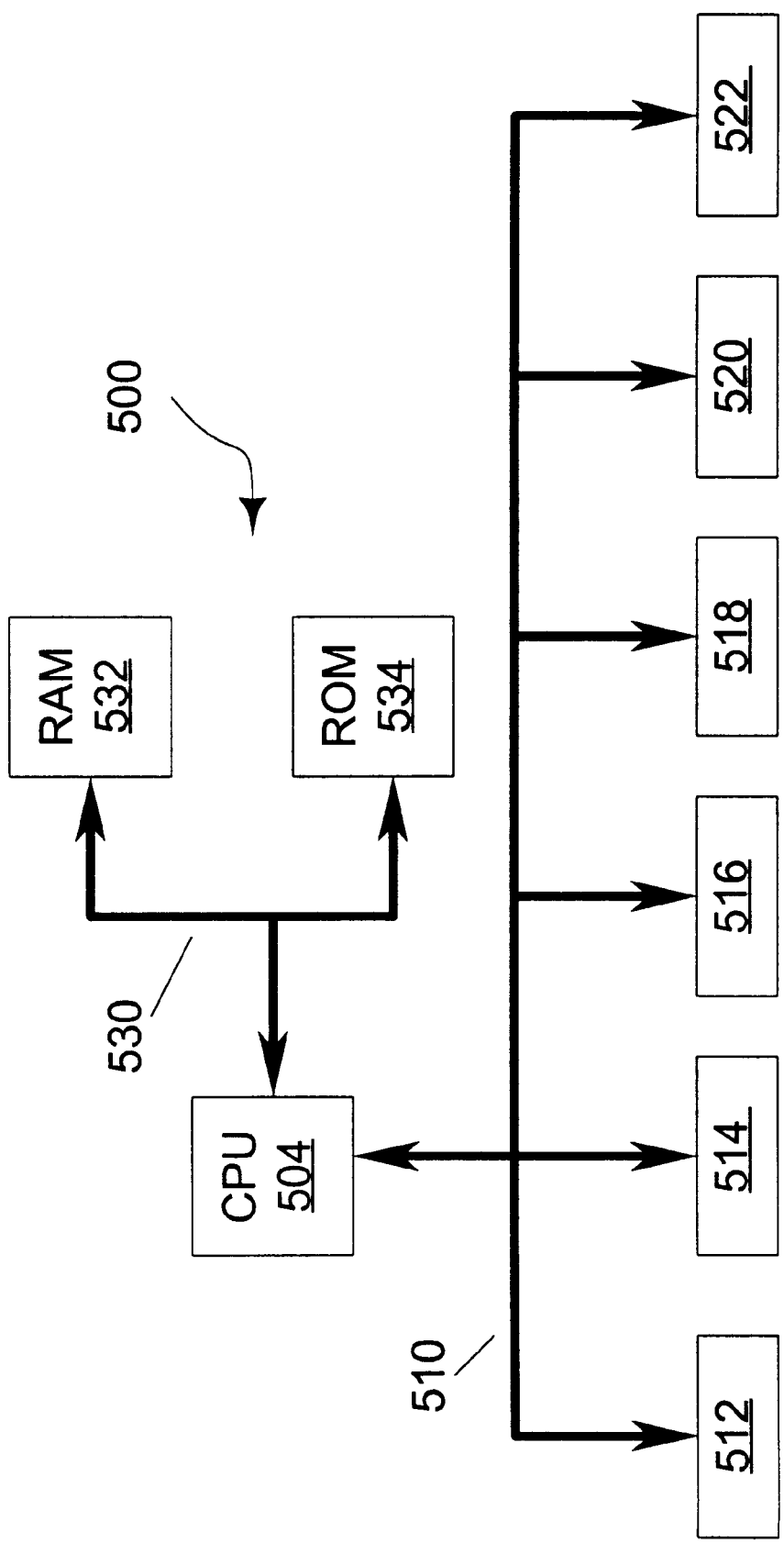

Referring next to FIG. 2, advantageously the invention is well-suited for use in a device such as an integrated circuit chip, as well as an electronic system including a central processing unit, a memory and a system bus. The electronic system may be a computerized system 500 as shown in FIG. 3. The system 500 includes a central processing unit 500, a random access memory 532, and a system bus 530 for communicatively coupling the central processing unit 504 and the random access memory 532. The system 500 includes a device formed by the steps shown in and described in conjunction with FIGS. 1A–1G. The system 500 may also include an input/output bus 510 and several peripheral devices, such as devices 512, 514, 516, 518, 520 and 522, which may be attached to the input/output bus 510. Peripheral devices may include hard disk drives, floppy disk drives, monitors, keyboards, and other such peripherals.

Formation of lightly doped regions under a gate via gate autodoping has been described. Although specific embodiments have been illustrated and described herein, it will be appreciated by those of ordinary skill in the art that this application is intended to cover any adaptations or variations of the present invention. Therefore, it is manifestly intended that this invention be limited only by the following claims and equivalents thereof.

We claim:

1. A semiconductor device comprising:
   a gate having a side extending over a gate oxide over a semiconductor substrate, each of the gate and the gate oxide having respective lengths where the length of the gate oxide is less than the length of the gate;
   at least one lightly doped region within the substrate and completely underneath the side of the gate extending over the gate oxide; and
   a spacer adjacent to each of two sidewalls of the gate, and with the spacer and the side of the gate extending over the gate oxide partially defining at least one cavity between the substrate and the gate.

2. The device of claim 1, wherein each spacer, the gate, the substrate and the gate oxide define an air cavity.

3. The device of claim 1, further comprising heavily doped regions within the substrate adjacent to the two sidewalls of the gate.

4. The device of claim 3, wherein the heavily doped regions are formed by application of an ion implantation.

5. The device of claim 1, wherein the length of the gate oxide is less than the length of the gate because of etching selective to the gate oxide.

6. The device of claim 5, wherein selective etching is performed via an HF dip.

7. The device of claim 5, wherein selective etching is performed via a plasma etch.

8. A computerized system comprising at least one semiconductor device, each device comprising:
   a gate having a side extending over a gate oxide over a semiconductor substrate, each of the gate and the gate oxide having respective lengths where the length of the gate oxide is less than the length of the gate;
   at least one lightly doped region within the substrate and completely underneath the side of the gate extending over the gate oxide; and
   a spacer adjacent to each of two sidewalls of the gate, and with the spacer and the side of the gate extending over the gate oxide partially defining at least one cavity between the substrate and the gate.

9. The system of claim 8, wherein each spacer, the gate, the substrate and the gate oxide of each device define an air cavity.

10. The system of claim 8, wherein each device further comprises heavily doped regions within the substrate adjacent to the two sidewalls of the gate.

11. The system of claim 8, wherein the length of the gate oxide within each device is less than the length of the gate because of etching selective to the gate oxide.

12. The system of claim 11, wherein selective etching is performed via an HF dip.

13. The system of claim 11, wherein selective etching is performed via a plasma etch.

14. The device of claim 11, wherein said at least one cavity is defined by the spacer, the side of the gate extending over the gate oxide, the substrate and the gate oxide.

15. The device of claim 14, wherein said at least one cavity is an air cavity.

16. The device of claim 8, wherein said at least one cavity is defined by the spacer, the side of the gate extending over the gate oxide, the substrate and the gate oxide.

17. A semiconductor device comprising:
   a gate having a side extending over a gate oxide over a semiconductor substrate, each of the gate and the gate oxide having respective lengths where the length of the gate oxide is less than the length of the gate;
   at least one lightly doped region within the substrate and completely underneath the side of the gate extending over the gate oxide; and
   a spacer adjacent to each of two sidewalls of the gate, and with the spacer, the side of the gate extending over the gate oxide, the substrate and the gate oxide defining at least one air cavity between the substrate and the gate.

* * * * *